(12) United States Patent
Brocato et al.

(10) Patent No.: US 11,671,054 B2
(45) Date of Patent: Jun. 6, 2023

(54) OSCILLATOR FOR ADIABATIC COMPUTATIONAL CIRCUITRY

(71) Applicant: National Technology & Engineering Solutions of Sandia, LLC, Albuquerque, NM (US)

(72) Inventors: Robert W. Brocato, Sandia Park, NM (US); Michael P. Frank, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 149 days.

(21) Appl. No.: 17/406,240

(22) Filed: Aug. 19, 2021

(65) Prior Publication Data

US 2023/0114017 A1    Apr. 13, 2023

Related U.S. Application Data

(60) Provisional application No. 63/072,561, filed on Aug. 31, 2020.

(51) Int. Cl.
*H03B 5/12* (2006.01)
*H03F 3/217* (2006.01)

(52) U.S. Cl.
CPC .......... *H03B 5/12* (2013.01); *H03F 3/2176* (2013.01)

(58) Field of Classification Search
CPC .............................. H03B 5/12; H03F 3/2176
See application file for complete search history.

(56) References Cited

U.S. PATENT DOCUMENTS

| | | | | |
|---|---|---|---|---|
| 2007/0018739 A1* | 1/2007 | Gabara | ..................... | G06F 1/10 331/167 |
| 2012/0319498 A1* | 12/2012 | Silberberg | ............. | H01F 38/14 307/104 |
| 2020/0320426 A1* | 10/2020 | Amin | ................... | H10N 60/805 |

OTHER PUBLICATIONS

Anantharam, V. et al., "Driving Fully-Adiabatic Logic Circuits Using Custom High-Q MEMS Resonators," Proceedings of the International Conference on Embedded Systems and Applications (2004) Las Vegas, Nevada, Jun. 21-24, 7 pages.

Athas, W. C. et al., "An Energy-Efficient CMOS Line Driver Using Adiabatic Switching," Proceedings of the 4th Great Lakes Symposium on VLSI (1994) Mar. 4-5, 4 pages.

(Continued)

*Primary Examiner* — Jeffrey M Shin
(74) *Attorney, Agent, or Firm* — Mark A. Dodd (57) ABSTRACT

An adiabatic resonator, an adiabatic oscillator, and an adiabatic oscillator system are disclosed. An adiabatic system is one that ideally transfers no heat outside of the system, thereby reducing the required operating power. The adiabatic resonator, which includes a plurality of tank circuits, acts as an energy reservoir, the missing aspect of previously attempted adiabatic computational systems. By using the adiabatic resonator as a feedback element with an amplifier, an adiabatic oscillator is formed. An adiabatic oscillator system is formed with a primary adiabatic oscillator feeding a plurality of secondary adiabatic oscillators. In this manner, the adiabatic oscillator system may be used to generate the multiple clock signals required of adiabatic computational logic elements, such as Split-level Charge Recovery Logic and 2-Level Adiabatic Logic. The adiabatic oscillator system stores enough energy to drive many individual adiabatic computational logic elements, permitting implementation of complex logic circuits.

19 Claims, 9 Drawing Sheets

(56) References Cited

OTHER PUBLICATIONS

Bhuvana, B.P. et al., "Design of FinFET-based Energy Efficient Pass-Transitor Adiabatic Logic for ultra-low power applications," Microelectronics Journal (2019) 92:104601, 11 pages.

Feynman, R. P., "Quamtum Mechanical Computers," Foundations of Physics (1986) 16(6):507-531.

Frank, M. P., "Efficient, two-level, fully-adiabatic, pipelineable logic family," Invention Disclosure, University of Florida, Jun. 2002, 20 pages.

Frank, M. P., "Lecture 15 More on Adiabatic Circuits," Physical Limits of Computing, University of Florida, Spring 2000, http://revcomp.info/ legacy/mpf/readings/Lec15-adiamisc.pdf, 7 pages.

Frank, M., "Physical Limits of Computing, Lecture #24, Adiabatic CMOS cont." Physical Limits of Computing, University of Florida, Mar. 13, 2002, http://revcomp.info/legacy/revcomp/physlim/PhysLimL24.ppt, 20 pages.

Frank, M. P. et al., "Design & feasibility study for practical adiabatic logic driven by custom high-Q MEMS/NEMS clock/power resonators," University of Florida, 5 pages.

Frank, M. P., "Common Mistakes in Adiabatic Logic Design and How to Avoid Them," Embedded Systems and Applications (2003) 7 pages.

He, M. et al., "CMOS-MEMS Resonator as a Signal Generator for Fully-Adiabatic Logic Circuits," Proceedings of the SPIE, Smart Structures, Devices, and Systems II (2005) Al-Sarawi, S. F. (eds.), SPIE, Bellingham, WA, vol. 5649, pp. 126-136.

Koller, J. G. et al., "Adiabatic Switching, Low Energy Computing, and the Physics of Storing and Erasing Information," Workshop on Physics and Computation (1992) Oct. 2-4, Dallas, TX, 4 pages.

Landauer, R., "Uncertainty Principle and Minimal Energy Dissipation in the Computer," International Journal of Theoretical Physics (1982) 21(3/4):283-297.

Xie, H. et al., "Design for MOSIS Educational Program (Research)," University of Florida, Mar. 24, 2004, 5 pages.

Younis, S. G.., Asymptotically Zero Energy Computing Using Split-Level Charge Recovery Logic, Thesis, Massachusetts Institute of Technology (1994) 114 pages.

Younis, S. G. et al., "Non-Dissipative Rail Drivers for Adiabatic Circuits," Proceedings Sixteenth Conference on Advanced Research in VLSI (1995) Mar. 27-29, Chapel Hill, NC, 11 pages.

* cited by examiner

OSCILLATOR FOR ADIABATIC COMPUTATIONAL CIRCUITRY

RELATED APPLICATIONS

This application claims priority to U.S. Provisional Application No. 63/072,561, filed on Aug. 31, 2020, and entitled OSCILLATOR FOR ADIABATIC COMPUTATIONAL CIRCUITRY, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to an adiabatic timing and energy recovery circuit (oscillator) for use with adiabatic logic cells and circuitry.

BACKGROUND

The concept of an adiabatic operation derives from thermodynamics. In thermodynamics, an adiabatic process is an operation within a system that uses energy to perform work without transferring energy in the form of heat outside of the system. By not transferring heat outside of the system, the adiabatic operation exhibits reversibility. That is, the adiabatic operation may be run either forward or in reverse with no additional input of energy beyond the work that is performed by the system. As such, the following definition from Enrico Fermi applies: "A transformation of a thermodynamical system is said to be adiabatic if it is reversible and if the system is thermally insulated so that no heat can be exchanged between it and its environment during the transformation." See E. Fermi, "Thermodynamics," Dover Publications, Inc., New York (1936). The classic example of an adiabatic operation is that of a gas in a closed cylinder which is used to perform work on a piston in that cylinder. The gas is slowly heated and then slowly cooled to move the piston back and forth within the cylinder. The energy to heat the gas comes from a reservoir, and when the gas is cooled, the energy is returned to that reservoir. The cylinder, piston, gas, and reservoir constitute the closed adiabatic system. The energy exchanges are generally performed slowly and at a constant rate to prevent the creation of any pressure waves, which will dissipate energy as heat.

The thermodynamic concept of adiabaticity has been extended to computational electronics to describe optimally efficient computational operations. These computational operations are frequently referred to as reversible computing, which implies that the energy used in the computational operation wastes no energy by dissipation into its environment. That is, the reversible computation is an optimally efficient means of performing computations. The concept of reversible computing was posited by Richard Feynman. See R. Feynman, "Quantum Mechanical Computers," Foundations of Physics, vol. 16, no. 6, pp. 507-531 (1986), the contents of which are incorporated herein by reference. Rolf Landauer presented a proof that there is no lower limit to the energy needed to perform a reversible computation. See R. Landauer, "Uncertainty Principle and Minimal Energy Dissipation in the Computer," International Journal of Theoretical Physics, vol. 21, nos. 3/4, pp. 283-297 (1982), the contents of which are incorporated herein by reference. That is, irreversible computations lose information and therefore increase entropy, but a reversible computation does not lose information and therefore need not increase entropy.

Saed Younis invented a methodology for performing reversible computations referred to as Split-level Charge Recovery Logic (SCRL). See S. G. Younis, "Asymptotically Zero Energy Computing Using Split-Level Charge Recovery Logic," Thesis for the Degree of Doctor of Philosophy, Massachusetts Institute of Technology (1994), the contents of which are incorporated herein by reference. Others have likewise advanced adiabatic computational technology. See W. C. Athas et al., "An Energy-Efficient CMOS Line Driver Using Adiabatic Switching,' Proceedings of the 1994 IEEE Great Lakes Symposium on VLSI, pp. 196-199 (1994); J. G. Koller and W. C. Athas, "Adiabatic Switching, Low Energy Computing, and the Physics of Storing and Erasing Information," Proceedings of the Physics of Computation Workshop, Dallas, Tex., pp. 267-270 (1992); and B. P. Bhuvana and B. V. S. Kanchana, "Design of FinFET-based Energy Efficient Pass-Transistor Adiabatic Logic for Ultra-low Power Applications," Microelectronics Journal, vol. 92, art. no. 104601 (2019), the contents of each of which are incorporated herein by reference. However, the logical computation elements only compare to the cylinder, piston, and gas in the canonical example.

There is still a need for a reservoir for the energy exchanged into and out of the computational elements. Work on reversible computing conducted thus far has lacked a means for storing and recycling the energy used in the computations. That is, it has lacked a suitable energy reservoir. Thus, the need exists for an energy reservoir.

SUMMARY

One aspect of the present invention relates to an oscillator to serve as both the energy reservoir for an adiabatic circuit system and as a clocking system for adiabatic computational logic elements. The adiabatic computational logic elements can be of several different types. The logic elements can be of the SCRL type of logic cells as described by Younis. The adiabatic computational logic elements can also be 2-Level Adiabatic Logic (2LAL) type of logic cells as described by Michael Frank. See M. Frank, "Lecture 15: More on Adiabatic Circuits," Lecture Notes, Physical Limits of Computing, University of Florida, Spring 2000, http://revcomp.info/legacy/mpf/readings/Lec15-adiamisc.pdf; M. Frank, "Lecture #24: Adiabatic CMOS cont.," Lecture Slides, Physical Limits of Computing, University of Florida, Mar. 13, 2002, http://revcomp.info/legacy/revcomp/physlim/PhysLimL24.ppt; M. Frank, "Efficient, two-level, fully-adiabatic, pipelineable logic family," invention disclosure, University of Florida, June 2002; M. Frank, "Common Mistakes in Adiabatic Logic Design and How to Avoid Them," Proceedings of the International Conference on Embedded Systems and Applications, Las Vegas, Nev., pp. 216-222 (2003); and V. Anantharam et al., "Driving Fully-Adiabatic Logic Circuits Using Custom High-Q MEMS Resonators," Proceedings of the International Conference on VLSI, Las Vegas, Nev., (2004), the contents of each of which are incorporated herein by reference. The requirement for reversibility in a circuit imposes several requirements on circuit operation. First, a switch must never be closed when there is a voltage across its terminals. Second, a switch must never be opened when there is a current passing through it. Finally, a reversible operation must never pass current through a diode, which has a voltage drop. Applying these conditions leads to the criteria for an adiabatic oscillator.

In at least one embodiment of the present invention, an adiabatic oscillator system comprises a primary adiabatic oscillator including a primary adiabatic oscillator output, a buffer electrically coupled to the primary adiabatic oscillator output (the buffer including a buffer output, the buffer decreasing an effect of next-stage loading), N secondary adiabatic oscillators (each including a respective secondary adiabatic oscillator output), and N phase-shifting circuits each electrically coupled to the buffer output (each of the N phase-shifting circuits including a respective phase-shifting circuit output, each of the N secondary adiabatic oscillators electrically coupled to a respective one of the phase-shifting circuit outputs, each of the N phase-shifting circuits inducing a corresponding phase shift at a corresponding one of the secondary adiabatic oscillator outputs), the primary adiabatic oscillator and each of the N secondary adiabatic oscillators each including an amplifier and an adiabatic resonator (the adiabatic resonator providing feedback to the amplifier, the adiabatic resonator including a plurality of tank circuits).

In various embodiments, the amplifier in each of the primary adiabatic oscillator and the N secondary adiabatic oscillators is one of an inverting amplifier, a differential amplifier, a cascode-connected amplifier, a class A amplifier, a class AB amplifier, a class C amplifier, a class D amplifier, a class E amplifier, or a class F amplifier; each of the plurality of tank circuits includes a capacitor or capacitive reactance element and an inductor or an inductive reactance element (the capacitor or capacitive reactance element and the inductor or inductive reactance element electrically connected in series or parallel); the inductor in each of the plurality of tank circuits has a same value; each adiabatic resonator further includes a plurality of winding-weighted transformers or weighted waveguide transformers (the plurality of tank circuits being electrically connected in series using the plurality of winding-weighted transformers or weighted waveguide transformers, and each of the winding-weighted transformers or weighted waveguide transformers having a corresponding weighting factor; and each of the weighting factors corresponds to a respective Fourier series weighting factor).

In other embodiments, the plurality of tank circuits includes at least three tank circuits; N equals 3 or 5; the primary adiabatic oscillator further includes a startup circuit; and the primary adiabatic oscillator and each of the N secondary adiabatic oscillators each outputs a corresponding substantially trapezoidal waveform.

In at least one embodiment of the present invention, an adiabatic oscillator comprises an amplifier and an adiabatic resonator (the adiabatic resonator providing feedback to the amplifier, the adiabatic resonator including a plurality of tank circuits), each of the plurality of tank circuits includes a capacitor or capacitive reactance element and an inductor or inductive reactance element (the capacitor or capacitive reactance element and the inductor or inductive reactance element electrically connected in series or parallel).

In various embodiments, the amplifier is one of an inverting amplifier, a differential amplifier, a cascode-connected amplifier, a class A amplifier, a class AB amplifier, a class C amplifier, a class D amplifier, a class E amplifier, or a class F amplifier; the inductor in each of the plurality of tank circuits has a same value; the adiabatic resonator further includes a plurality of winding-weighted transformers or weighted waveguide transformers (the plurality of tank circuits being electrically connected in series using the plurality of winding-weighted transformers or weighted waveguide transformers, each of the winding-weighted transformers or weighted waveguide transformers having a corresponding weighting factor, each of the weighting factors corresponds to a respective Fourier series weighting factor); the plurality of tank circuits includes at least three tank circuits; the adiabatic oscillator further comprises a startup circuit; and the adiabatic oscillator outputs a substantially trapezoidal waveform.

In at least one embodiment of the present invention, an adiabatic resonator comprises a plurality of tank circuits (each of the plurality of tank circuits includes a capacitor or capacitive reactance element and an inductor or inductive reactance element, the capacitor or capacitive reactance element and the inductor or inductive reactance element electrically connected in series or parallel).

In various embodiments, the inductor in each of the plurality of tank circuits has a same value; and the adiabatic resonator further comprises a plurality of winding-weighted transformers or weighted waveguide transformers (the plurality of tank circuits being electrically connected in series using the plurality of winding-weighted transformers or weighted waveguide transformers, each of the winding-weighted transformers or weighted waveguide transformers having a corresponding weighting factor, each of the weighting factors corresponds to a respective Fourier series weighting factor).

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 3A illustrates a non-adiabatic waveform generator, while

DETAILED DESCRIPTION

Figure 1:
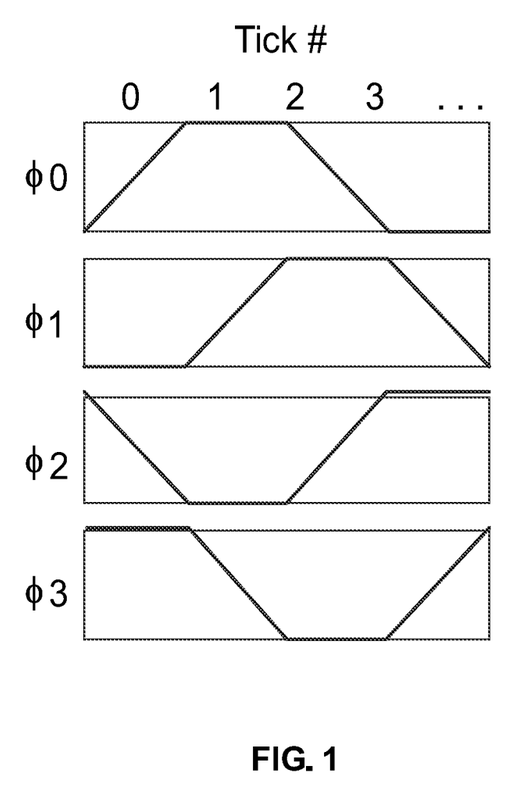
FIGS. 1 and 2A-2D illustrate the desired four equal phases of a four-clock adiabatic oscillator system in accordance with one or more embodiments of the present invention.
Figures 2A, 2B:
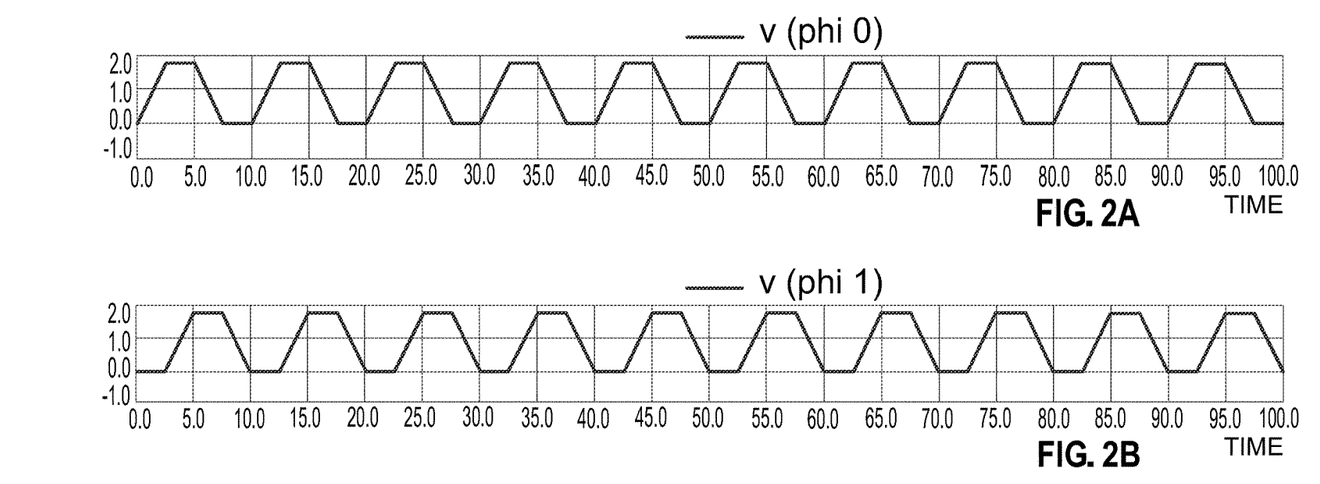
Figure 2C:
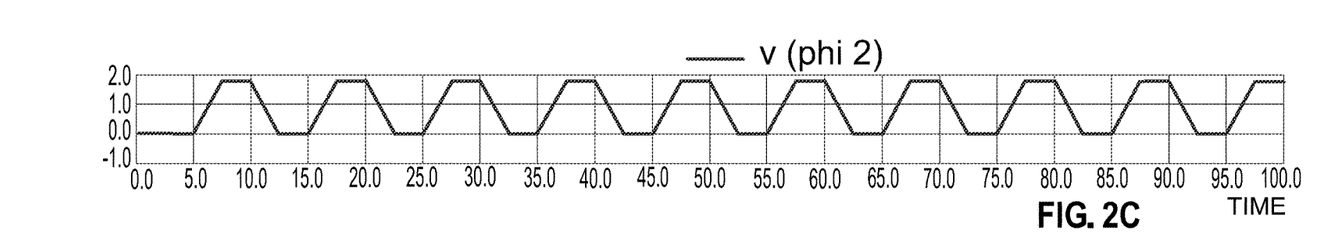
Figure 2D:
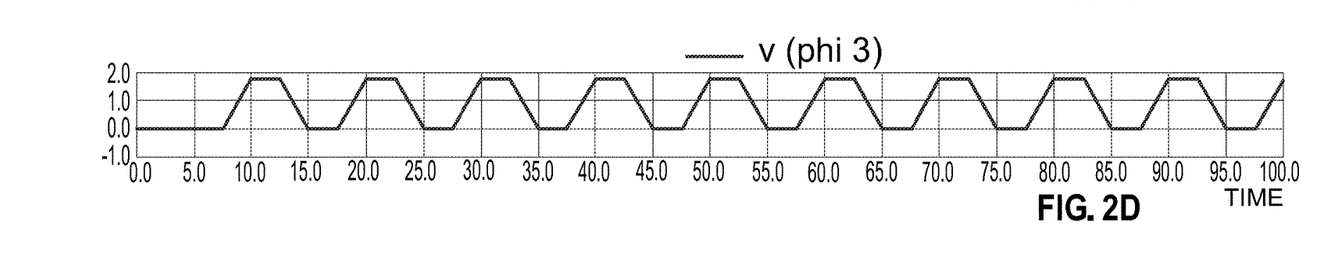

An adiabatic oscillator, in accordance with one or more embodiments of the present invention, optimized for adiabatic circuit operation must satisfy several criteria. First, the waveform must have linear, gradually sloped rise and fall times. This is to prevent the creation of higher harmonic content in the adiabatic energy transitions, which is analogous to the creation of pressure waves in the adiabatic expansion of gas in a cylinder. The pressure waves in the adiabatic expansion of the gas will cause dissipation of energy as heat, and, by analogy, the higher harmonic content during electrical signal transitions will likewise cause energy loss by heating. Second, a minimum of at least four different phase-synchronized clocks are required to drive either SCRL or 2LAL type logic cells. Each of these clocks must be phase synchronized to the other three clocks with the phase-offset between each clock equal to a multiple of 360°/4, i.e., 90°. The four equal phases of a four-clock adiabatic oscillator system in accordance with one or more embodiments of the present invention are illustrated in FIG. 1, with equal periods for slowly rising, stable-high, slowly falling, and stable-low portions of the signal. Some versions of SCRL type logic cells require six or more separate phase-separated clocks. Higher numbers of clocks, in accordance with one or more other embodiments of the present invention, are a straight-forward extension of the concepts described for the four-clock adiabatic clock system. The third requirement is that each clock should contain a number of zones equal to the number of clocks. That is, each clock in a four-clock system should have four separate, equal time-length time zones. Each of these time zones will be termed a "tick." The clocks of a four-clock adiabatic oscillator in accordance with one or more embodiments of the present invention are illustrated in FIGS. 2A-2D. Note that each clock in FIGS. 2A-2D has a phase distance from the next clock in the sequence equal to one tick. For the four-clock adiabatic system illustrated in FIGS. 2A-2D, each tick is 90°. For a six-clock adiabatic system, as is used in some versions of SCRL type logic cells, each tick is 60°.

Figure 3A:
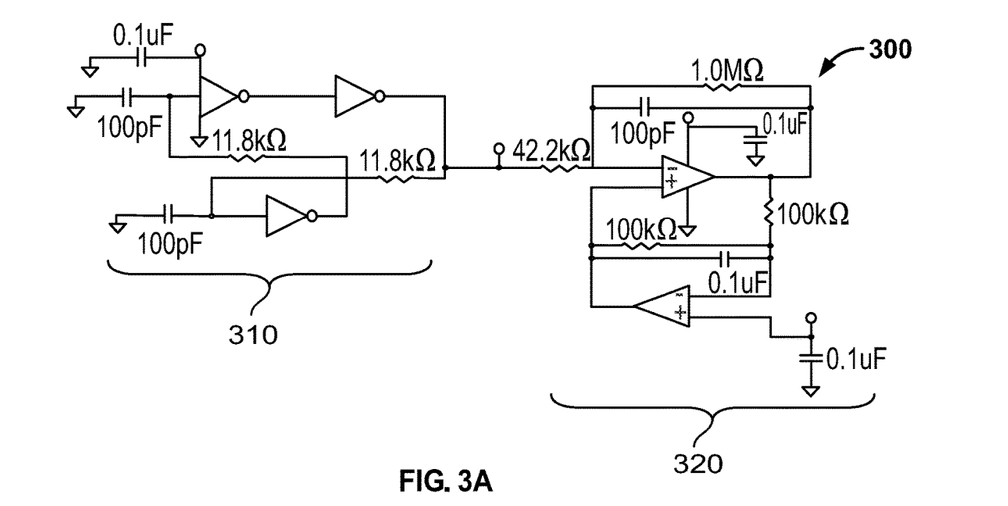
Figure 3B:
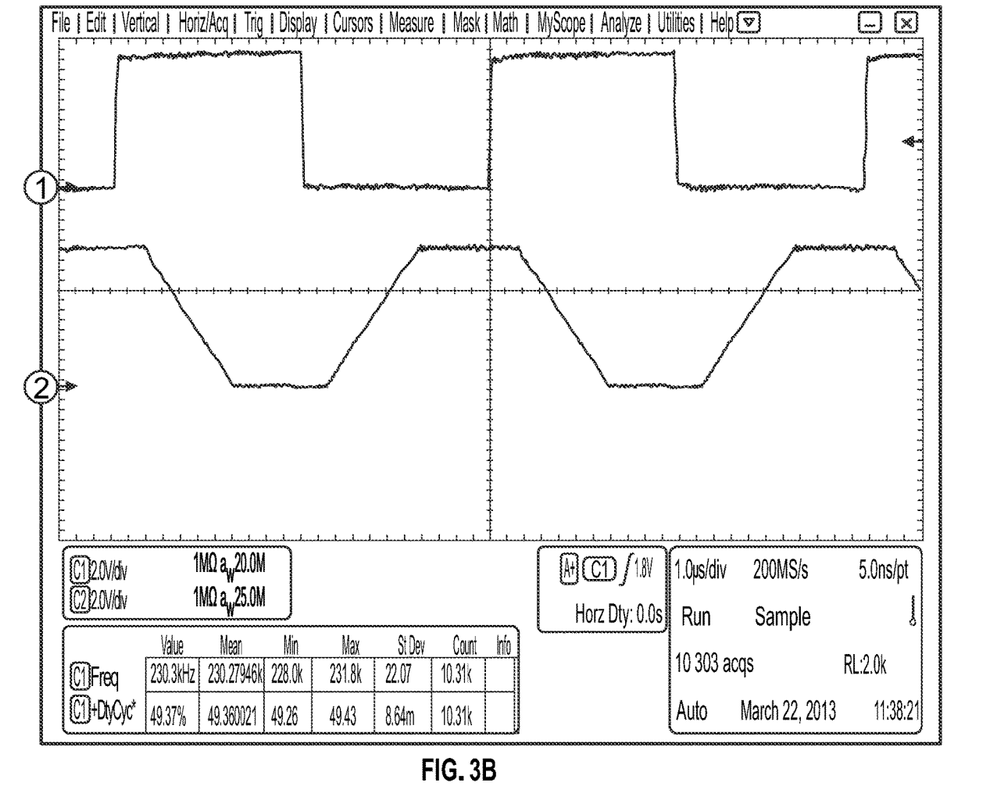
FIG. 3B illustrates the corresponding waveform of the non-adiabatic waveform generator.

The requirements of an adiabatic oscillator have been understood for some time. Further, it is not difficult to create the correct waveform. Signal generators that create the required waveform with multiple, phase-synchronized outputs are commonly available and can be purchased from commercial vendors. Other, more compact signal generators can be produced using analog circuit design techniques. One compact circuit implementation of a non-adiabatic waveform generator 300 is shown in FIG. 3A. This waveform generator 300 uses a portion of a hex inverter chip to form a square wave oscillator 310. An operational amplifier integrated circuit 320 is then used to form an integrator with an integration time matched to the oscillation frequency of the square wave oscillator. This integrator is also designed with enough gain to saturate at both the positive and negative rails. The resulting signal, illustrated in FIG. 3B, has the desired waveform to correctly drive an adiabatic computational circuit. Even though the output of the waveform generator 300 has the correct waveform to be an adiabatic oscillator, the use of such a waveform generator 300 is not adiabatic. This is because the energy used for computations is not stored and recycled by the waveform generator 300. This energy is not stored due to the lack of a reservoir capable of storing and recycling energy from the adiabatic computational circuit.

One solution can be better understood by first considering the desired waveform as a series of sinusoidal waveforms. The desired trapezoidal waveform can be decomposed into a summation of harmonic terms using the Fourier series with corresponding weighting factors. A six term, fundamental through eleventh harmonic, Fourier series, $v_{f6}(t)$, which substantially approximates the desired trapezoidal waveform can be expressed as follows:

$$v_{f6}(t) = V_A \left[ \frac{1}{2} + \frac{4\sqrt{2}}{\pi^2} \right. \quad\quad\quad\quad\quad\quad\quad\quad\quad\quad \text{(Eq. 1)}$$

$$\left. \left( \sin(\omega t) + \frac{\sin(3\omega t)}{3^2} - \frac{\sin(5\omega t)}{5^2} - \frac{\sin(7\omega t)}{7^2} + \frac{\sin(9\omega t)}{9^2} + \frac{\sin(11\omega t)}{11^2} \right) \right]$$

Figure 4:
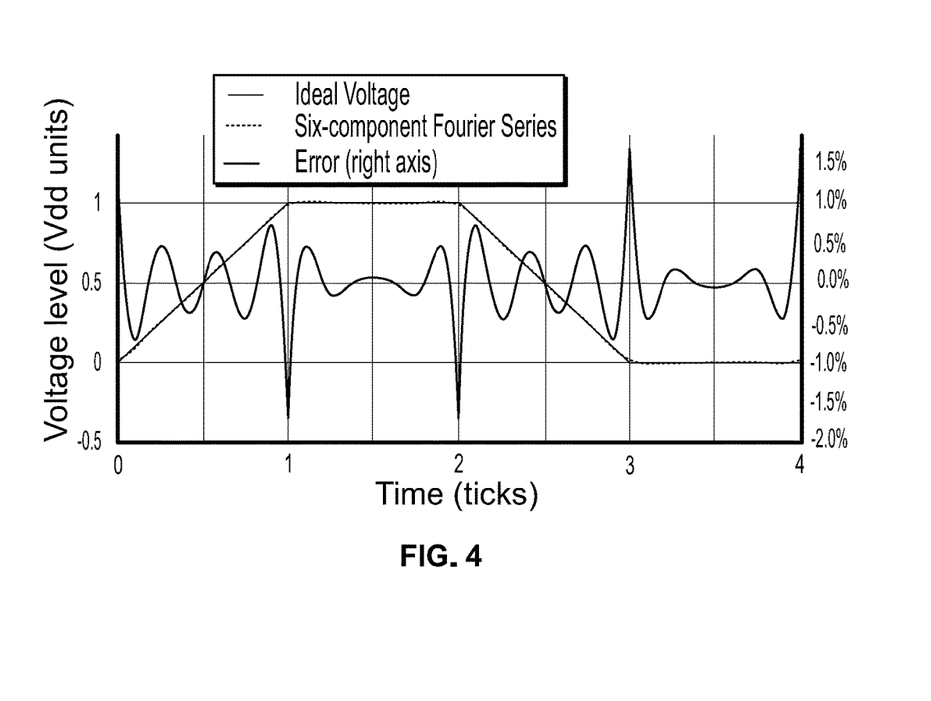
FIG. 4 illustrates the simulated four equal phases and error of a six term adiabatic oscillator in accordance with one or more embodiments of the present invention.

In Equation 1, $V_A$ is the amplitude term and is of arbitrary value, $\omega$ is the radian frequency, equal to $2\pi f$, where f is the clock frequency. The signal produced by this waveform is illustrated in FIG. 4, along with its error waveform in a magnified view. The six terms of the Fourier series provide a close approximation to the desired waveform. The additional harmonic content is minimal, and an implementation of the Fourier series oscillator would provide a high-quality adiabatic oscillator, if such an oscillator could be formed that would enable the storage and reuse of energy from the external circuit with an overall high circuit Q. The waveform fidelity impacts the overall efficiency of the adiabatic oscillator. Thus, while an adiabatic oscillator may function with a single term Fourier series approximation, i.e., the fundamental term, its efficiency will be less than the six term Fourier series approximation given by Equation 1. Thus, one is left with an engineering trade-off between overall efficiency and the complexity of the implementing circuit, though a three term Fourier series approximation appears to be the minimum for reasonable efficiency.

A circuit implementation of any single term of the Fourier series can be obtained by electrically connecting either in series or in parallel a capacitor of capacitance C with an inductor of inductance L to form a tank circuit. The loss of the tank circuit determines the circuit Q. Tank circuit loss typically arises from the combined effects of inductor parasitic resistance, interconnect parasitic resistance, and capacitor dielectric losses. The values of C and L must be chosen such that the following equation holds for any term of the Fourier series:

$$N\omega = \frac{1}{\sqrt{LC}} \quad\quad\quad \text{(Eq. 2)}$$

In Equation 2, $\omega$ is the radian frequency, as before. The Fourier component index N is equal to 1, 3, 5, 7, 9, or 11 indicating the index of the harmonic term from Equation 1. Equation 2 holds whether the capacitor and inductor are connected in series or in parallel. To obtain terms of the Fourier series in Equation 1, a collection of six tank circuits can be created from different L and C values, satisfying Equation 2 for all six harmonic index terms. If more or fewer harmonic terms are used, the trapezoidal waveform will be reproduced with greater or lesser fidelity, respectively.

Once the tank circuits representing each harmonic term have been created, they need to be combined. To combine the tank circuit elements just described, interconnection circuitry is needed. The requirements of this interconnection circuitry are several. First, the interconnection circuitry must allow energy to move into and out of the different tank circuits with minimal losses. That is, the interconnection circuitry should be low loss and reciprocal. Second, the interconnection circuitry must enable the application of amplitude weighting terms from the Fourier series to be applied to each tank circuit. Third, the interconnection circuitry must enable the summation of contributions from each tank circuit element to be added together into a single output to drive the adiabatic computational circuitry. Fourth, the interconnection circuitry must perform its combination function while minimizing the required external energy. Finally, the interconnection circuitry should enable the apportioning of energy to and from the different tank circuits while minimizing interactions between the different tank circuits. That is, the output of each tank circuit when series connected with the outputs of the other tank circuits should appear as a low impedance load at the resonant frequency of every other tank circuit in the overall device. Thus, at a given harmonic frequency, the circuit impedance should be dominated only by the impedance of the tank circuit resonant at that frequency.

Figure 5:
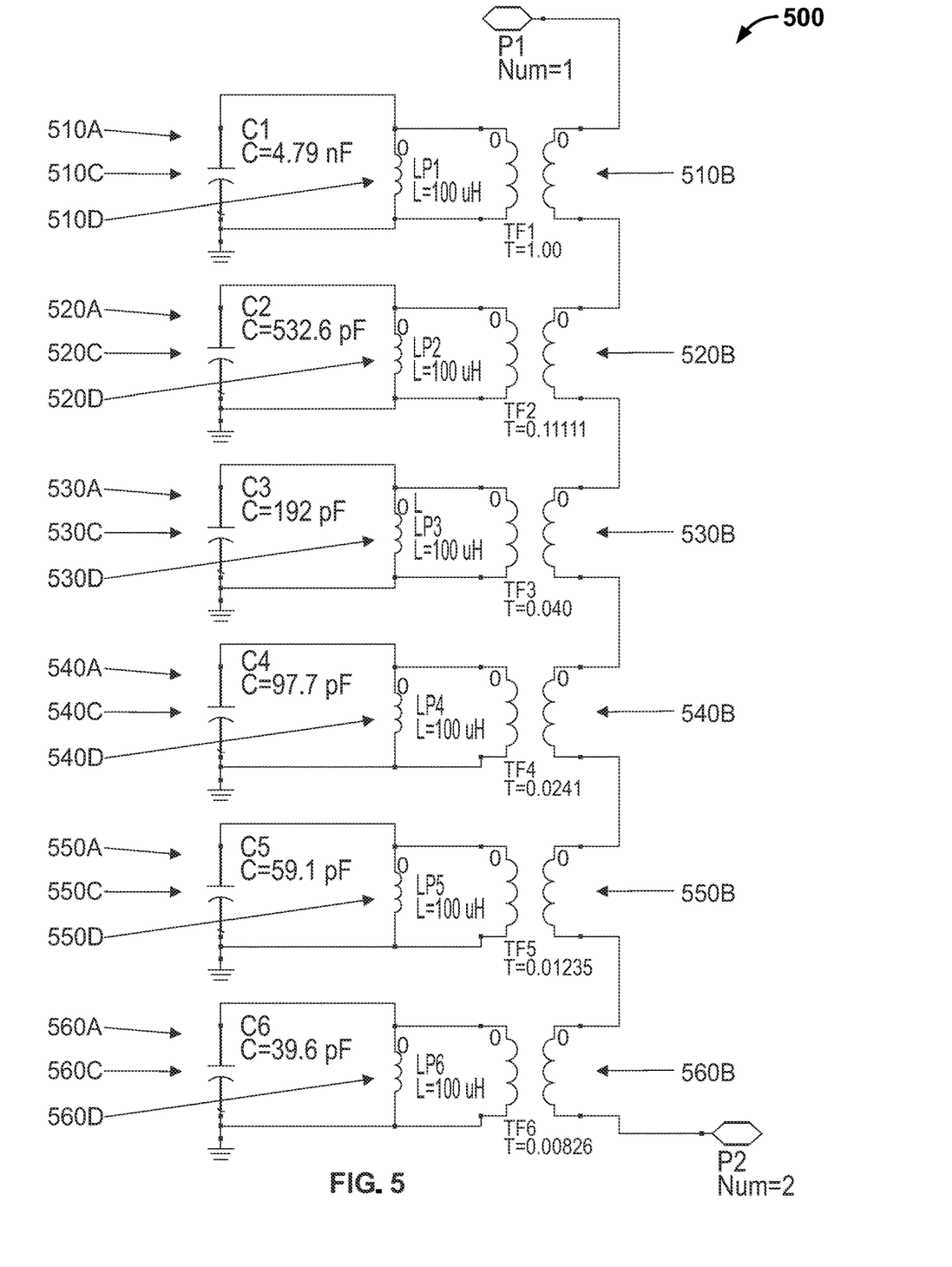
FIG. 5 illustrates an adiabatic resonator in accordance with one or more embodiments of the present invention.

The requirements for the individual tank circuits and the requirements for the interconnection circuitry are satisfied by the adiabatic resonator 500 in accordance with one or more embodiments of the present invention illustrated in FIG. 5. The adiabatic resonator 500 can be combined with an amplifier (not illustrated) to form an adiabatic oscillator suitable for driving adiabatic circuitry. The adiabatic resonator 500 in FIG. 5 consists of six ground-referenced, parallel-connected LC tank circuits 510A, 520A, 530A, 540A, 550A, 560A with each tank circuit 510A, 520A, 530A, 540A, 550A, 560A isolated by a corresponding winding-weighted transformer 510B, 520B, 530B, 540B, 550B, 560B. The winding-weighted factors correspond to the Fourier series weighting factors for the respective harmonic frequency of each LC tank circuit 510A, 520A, 530A, 540A, 550A, 560A. The transformer outputs for each winding-weighted transformer 510B, 520B, 530B, 540B, 550B, 560B are electrically interconnected in series.

The adiabatic resonator 500 of FIG. 5 accomplishes each of the objectives previously described. Each term of the Fourier series is created by a corresponding one of the six different LC tank circuits 510A, 520A, 530A, 540A, 550A, 560A, each of which satisfy Equation 2. These tank circuits 510A, 520A, 530A, 540A, 550A, 560A are shown as capacitor C1 510C parallel connected with inductor LP1 510D to resonate at frequency w, capacitor C2 520C parallel connected to inductor LP2 520D to resonate at frequency 3ω, capacitor C3 530C parallel connected to inductor LP3 530D to resonate at frequency 5ω, capacitor C4 540 C parallel connected to inductor LP4 540D to resonate at frequency 7ω, capacitor C5 550C parallel connected to inductor LP5 550D to resonate at frequency 9ω, and capacitor C6 560C parallel connected to inductor LP6 560D to resonate at frequency 11ω. Each of these tank circuits 510A, 520A, 530A, 540A, 550A, 560A is ground referenced, meaning that both the capacitor and the inductor have one of their terminals connected to ground. One further aspect of these tank circuits 510A, 520A, 530A, 540A, 550A, 560A is that they may all use the same value of inductor 510D, 520D, 530D, 540D, 550D, 560D, though this is not required. Inductance can be very difficult to tune or make small changes to, whereas capacitance is easy to tune by adding or removing small values of capacitance. Hence, the tank circuits 510A, 520A, 530A, 540A, 550A, 560A illustrated in FIG. 5 are easily built with readily available components by using a single, fixed inductor 510D, 520D, 530D, 540D, 550D, 560D for all tank circuits 510A, 520A, 530A, 540A, 550A, 560A and variable, tuning capacitors 510C, 520C, 530C, 540C, 550C, 560C with different values tuned for each corresponding tank circuit 510A, 520A, 530A, 540A, 550A, 560A.

In Equation 1, the additive term $V_A/2$ creates a fixed voltage offset that can be added by adding a DC bias signal to an amplifier (not illustrated in FIG. 5). The multiplication factor $V_A \, 4\sqrt{2}/\pi$ represents a gain term that can be obtained by adjusting the gain of any subsequent amplification stage (also not illustrated in FIG. 5). The six LC tank circuits 510A, 520A, 530A, 540A, 550A, 560A illustrated in FIG. 5 represent the six terms sin(ωt), sin(3ωt), sin(5ωt), sin(7ωt), sin(9ωt), and sin(11ωt), respectively. Each of these terms is multiplied by the term $1/N^2$. These multiplication, i.e., weighting, factors are obtained from the winding-weighted terms of the series electrically connected winding-weighted transformers 510B, 520B, 530B, 540B, 550B, 560B. That is, the transformer turns ratio obtained from the ratio of tank-circuit-side number of windings ($N_i$) to output-side number of windings ($N_o$) is set equal to the multiplication term $1/N^2$ with N being the Fourier index, as follows:

$$\frac{1}{N^2} = \frac{N_i}{N_o} \qquad \text{(Eq. 3)}$$

To create a negative sign in front of the $1/N^2$ term, the tank-circuit-side winding can be reversed with respect to the output-side winding. With this information and Equations 2 and 3, one can create the adiabatic resonator 500 illustrated in FIG. 5 which implements the Fourier expansion of Equation 1.

When operating at relatively low frequencies, the tuning capacitors 510C, 520C, 530C, 540C, 550C, 560C may be implemented using, for example, bulk or integrated capacitors. However, as the operating frequency increases, the parasitic non-idealities of these capacitors become too large. Thus, at higher operating frequencies, the tuning capacitors 510C, 520C, 530C, 540C, 550C, 560C may be implemented using capacitive reactance elements. In like manner, when operating at relatively low frequencies, the inductors 510D, 520D, 530D, 540D, 550D, 560D may be implemented using, for example, bulk or integrated inductors. However, as the operating frequency increases, the parasitic non-idealities of these inductors also become too large. Thus, at higher operating frequencies, the inductors 510D, 520D, 530D, 540D, 550D, 560D may be implemented using inductive reactance elements. When using inductive reactance elements, in contrast to using bulk or integrated inductors, there is little benefit to employing the same value for each of the inductive reactance elements.

Capacitive reactance elements and inductive reactance elements can be created from a variety of electromagnetic structures, for example, microstrips, coplanar waveguides, and rectangular or circular waveguide sections. As an example, each of the tank circuits 510A, 520A, 530A, 540A, 550A, 560A can contain an E-field segment with a capacitive reactance (corresponding to the tuning capacitors 510C, 520C, 530C, 540C, 550C, 560C) and an H-field segment with an inductive reactance (corresponding to the inductors 510D, 520D, 530D, 540D, 550D, 560D). In some embodiments, each of the tank circuits 510A, 520A, 530A, 540A, 550A, 560A is implemented using a waveguide tank element combining the capacitive reactance element and the inductive reactance element into a single segment containing both elements physically co-located in the same segment of a waveguide. In embodiments that employ waveguides, the tank circuits 510A, 520A, 530A, 540A, 550A, 560A can be combined using weighted waveguide transformers in place of bulk transformers for the winding-weighted transformers 510B, 520B, 530B, 540B, 550B, 560B.

Figure 6:
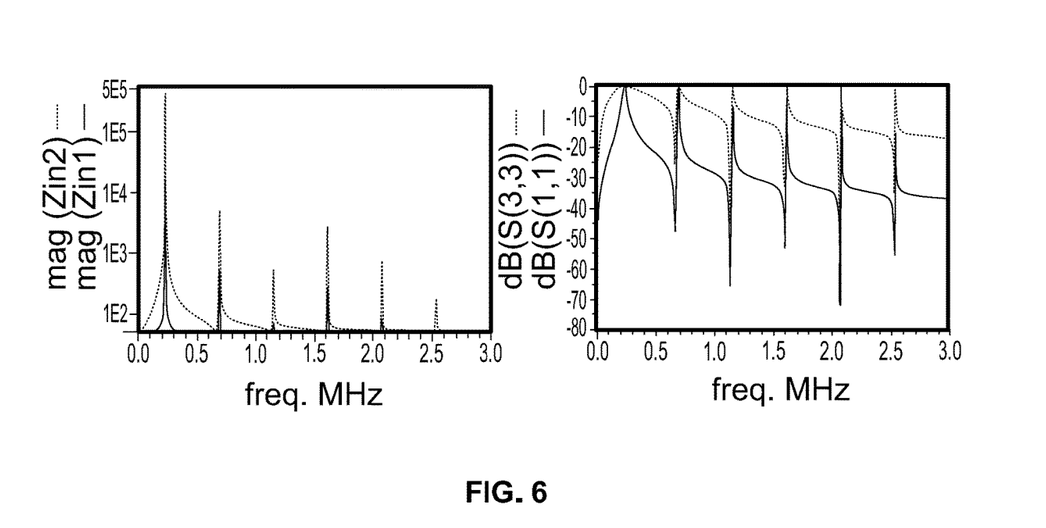
FIG. 6 illustrates the simulated input impedance and S-parameter measurements for two adiabatic resonator circuits in accordance with one or more embodiments of the present invention.

The impedance of the adiabatic resonator 500 in FIG. 5 can be seen in the simulation results illustrated in FIG. 6. FIG. 6 illustrates simulated input impedance and S-parameter measurements performed on two similar adiabatic resonator circuits, each in accordance with one or more embodiments of the present invention. The first adiabatic resonator is formed using 10 μH for all tank circuit inductors (the red curve in FIG. 6) while the second adiabatic resonator is formed using 100 μH for all tank circuit inductors (the blue curve in FIG. 6). Both adiabatic resonators are designed to have fundamental frequencies, $\omega/2\pi$, of 230 kHz. Note that the resistance of the tank circuit inductors is typically the primary factor controlling the circuit Q, with greater resistance decreasing the circuit Q and broadening the frequency response curve. The capacitances for each tank circuit are selected using equation (2) to obtain the various harmonic frequencies for both adiabatic resonator circuits. From FIG. 6, it is apparent that the impedance of each tank circuit provides a spike in impedance at the harmonic frequency for which the tank circuit is tuned. At each harmonic frequency the impedance of the other transformer coupled tank circuits is very low, satisfying the final design criterion stated above; i.e., that "the output of each tank circuit when series connected with the outputs of other tank circuits should appear as a low impedance load at the resonant frequency of every other tank circuit in the overall device. That at a given harmonic frequency, the circuit impedance should be dominated only by the impedance of the tank circuit resonant at that frequency."

The impedance and S-parameter plots illustrated in FIG. 6 indicate that each adiabatic resonator is operating as an energy reservoir that is reciprocal to the movement of energy into and out of the adiabatic reservoir. That is, energy may move freely into or out of the adiabatic reservoir with no significant barrier to movement in either direction. Furthermore, the movement of that energy is done at very low loss and without the addition of a significant amount of externally supplied energy. However, some externally supplied energy is needed to start the adiabatic resonator and to maintain oscillations by overcoming the 1/Q energy losses of the adiabatic resonator and the cycle-by-cycle energy losses of the driven adiabatic circuitry due to any adiabatic circuitry non-idealities. From the results illustrated in FIG. 6, the circuit Q of the adiabatic resonator 500 illustrated in FIG. 5 is calculated to be 3000. Also, the energy storage quantity in the adiabatic resonator 500 is larger than all but the largest adiabatic computational circuits. The capacitance of the adiabatic resonator 500 illustrated in FIG. 5 is equivalent to the capacitance of about 1.1 million adiabatic computational logic elements (5.711 nF total capacitance at 5 fF per logic element). This is useful for VLSI or ULSI implementations of adiabatic computational circuitry.

Figure 7:
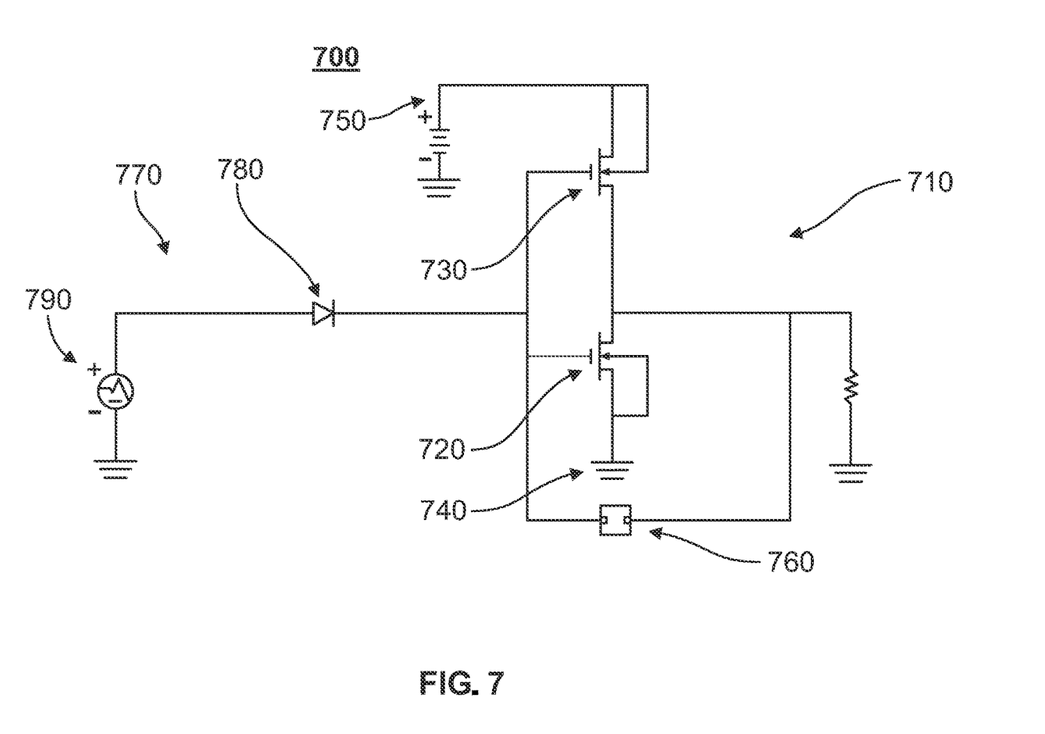
FIG. 7 illustrates an adiabatic oscillator in accordance with one or more embodiments of the present invention.

The source of this externally supplied energy can be an inverting amplifier 710 that uses an adiabatic resonator, for example, adiabatic resonator 500, as a feedback element to form an adiabatic oscillator 700. One possible implementation of the adiabatic oscillator 700, in accordance with one or more embodiments of the present invention, is illustrated in FIG. 7. The adiabatic oscillator 700 consists of the inverting amplifier 710 composed of two transistors, MOSFET1 720, an NMOS transistor, and MOSFET2 730, a PMOS transistor. The transistors 720, 730 are connected in an inverter-type configuration with interconnected gates and drains and with the source of NMOS transistor 720 connected to ground 740 and the source of the PMOS transistor 730 connected to the supply voltage 750. This type of amplifier 710 is only one of several possible amplifier types that can be used in an adiabatic oscillator. Differential cascode-connected, class A, class AB, class C, class D, class E, or class F amplifiers could also be used to achieve even higher efficiency than the amplifier 710 illustrated in FIG. 7. In FIG. 7, the adiabatic resonator 760, for example, the adiabatic resonator 500 illustrated in FIG. 5, is depicted as a box with two terminals corresponding to the P1 and P2 terminals illustrated in FIG. 5. Because the adiabatic resonator 500 is passive and reciprocal, it may be used as the adiabatic resonator 760 with terminal P1 as the input and terminal P2 as the output, or vice-versa. The adiabatic resonator 760 is connected between the gates of the transistors 720, 730 and the drains of the transistors 720, 730. Placing the adiabatic resonator 760 in a series connection between the gates of the transistors 720, 730 and the drains of the transistors 720, 730 allows the adiabatic resonator 760 to act as a feedback element in a shunt-shunt feedback configuration. The shunt-shunt feedback configuration creates a transimpedance amplifier with conductive feedback. The combination feedback adiabatic resonator 760 and amplifier 710 will oscillate where the loop gain is greater than one. This occurs at conductance nulls of the adiabatic resonator 760, or the impedance peaks of the adiabatic resonator 760. As previously discussed, this occurs at the primary peak of the impedance, illustrated in FIG. 6, at 230 kHz.

The addition of a startup circuit 770 comprising a diode 780 and a voltage source 790 in FIG. 7 is for the purpose of starting the adiabatic oscillator 700 for the simulation used to generate FIGS. 8A-8D. A physical implementation of the adiabatic oscillator 700 may not need the startup circuit 770. The voltage source 790 provides a few pulses at the start of the simulation which are coupled through the diode 780 to the gates of the transistors 720, 730 of the amplifier 710. Once the pulses are finished, the diode 780 effectively isolates the amplifier 710/adiabatic resonator 760 combination from the voltage source 790. The use of a diode 780 violates one of the principles for adiabatic circuit operation, but the diode 780 is only operated in forward bias during the startup phase of oscillator operation, when the adiabatic oscillator 700 is not expected to operate adiabatically. The startup circuit 770 serves the same purpose as real-world noise and imperfections in the ideal world of the simulator. The voltage source 790 and diode 780 serve to start the adiabatic oscillator 700 which then goes on to operate independently of the startup circuit 770. This method provides an adequate simulation to real-world oscillator startup conditions. In the adiabatic oscillator 700, the startup circuit 770 may, in one or more simulations or physical circuit embodiments of the present invention, consist of a voltage-divider feeding in an external synchronization circuit. The startup circuit 770, in other simulations or physical circuit embodiments of the present invention, may include a pass switch, in lieu of the diode 780, to disconnect the startup circuit 770 from the input off the amplifier 710, after the adiabatic oscillator 700 has attained stable operation.

Figure 8A:
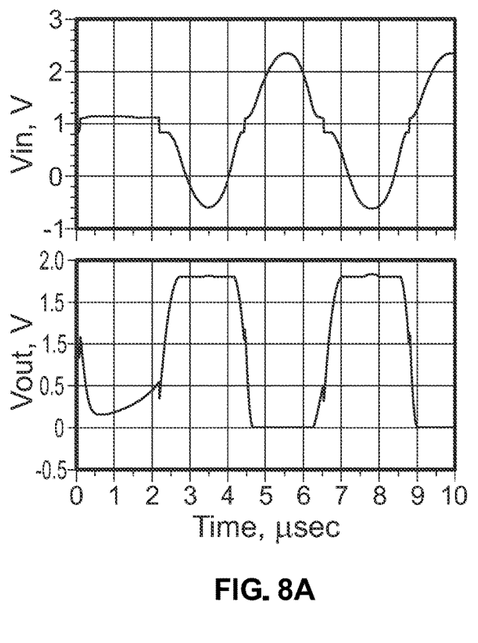
FIGS. 8A-8D illustrate the simulated output for the adiabatic oscillator illustrated in FIG. 7.
Figure 8B:
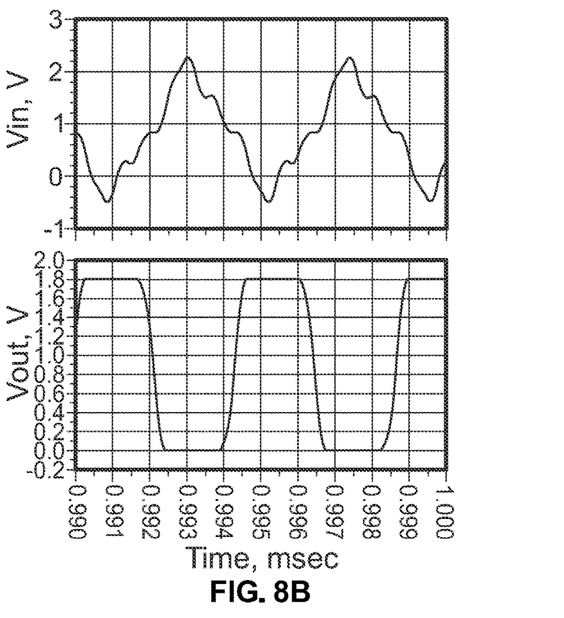
Figure 8C:
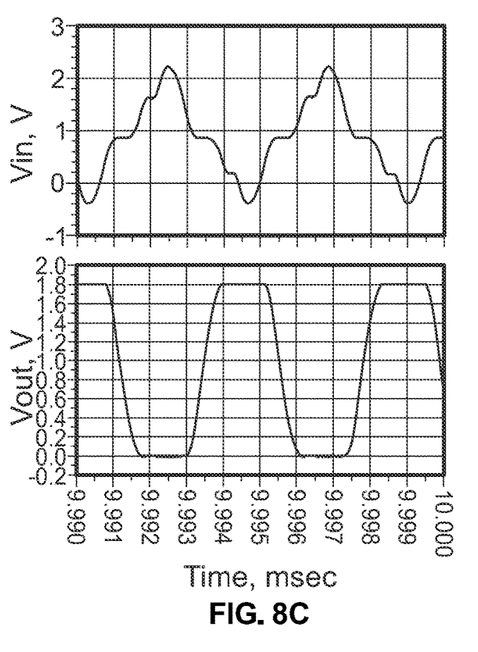
Figure 8D:
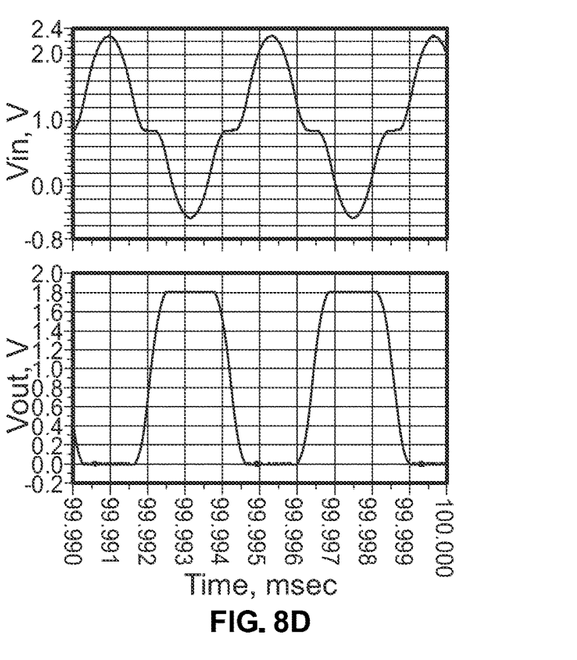

The results of a simulation of the adiabatic oscillator 700 are illustrated in FIGS. 8A-8D. It typically requires many cycles of an oscillator for the adiabatic oscillator 700 to start, run long enough to stabilize, and then run with steady oscillations. Consequently, to obtain useful insight into the performance of the adiabatic oscillator 700, one needs to look at multiple time periods separated by comparatively long periods of time. The simulation results illustrated in FIG. 8A-8D are just such a collection of snapshots of the output of the adiabatic oscillator 700 taken with long intervening periods in-between. The entire simulation lasts for 100 milliseconds of circuit time. The cycle time of the adiabatic oscillator 700 is approximately $\frac{1}{230}$ kHz, or about 4.35 μSec. Thus, the simulation covers about 23,000 oscillation cycles. A useful window with which to view the output of the adiabatic oscillator 700 is a little over two cycles in length, or about 10 μSec. The simulation results illustrated in FIG. 8A-8D are a series of four such 10 μSec snapshots taken at time=0 (FIG. 8A), 1 mSec (FIG. 8B), 10 mSec (FIG. 8C), and 100 mSec (FIG. 8D). The input and output of the amplifier 710 are shown in each snapshot. The final waveform, shown at 100 mSec in FIG. 8D, has a shape that closely resembles the ideal trapezoidal waveform, illustrated in FIGS. 1 and 2. The slope of the rising and falling edges of the waveform can be adjusted by changing the W/L ratios of the transistors 720, 730 while keeping the ratio of the two ratios, (W/L transistor 720)/(W/L transistor 730), constant. The addition of more tank circuits representing higher order Fourier terms, not included in equation (1), will add harmonic terms to the response of the adiabatic oscillator 700. This will tend to sharpen the edges of the output waveforms illustrated in FIGS. 8A-8D.

The output and input of the adiabatic oscillator 700 start out somewhat chaotic, as illustrated in FIG. 8A. Stabilization of oscillation occurs when the waveform at the high impedance input node of the amplifier 710 stabilizes. This takes many cycles to occur, finally settling out by the 100-millisecond snapshot illustrated in FIG. 8D.

Figure 9:
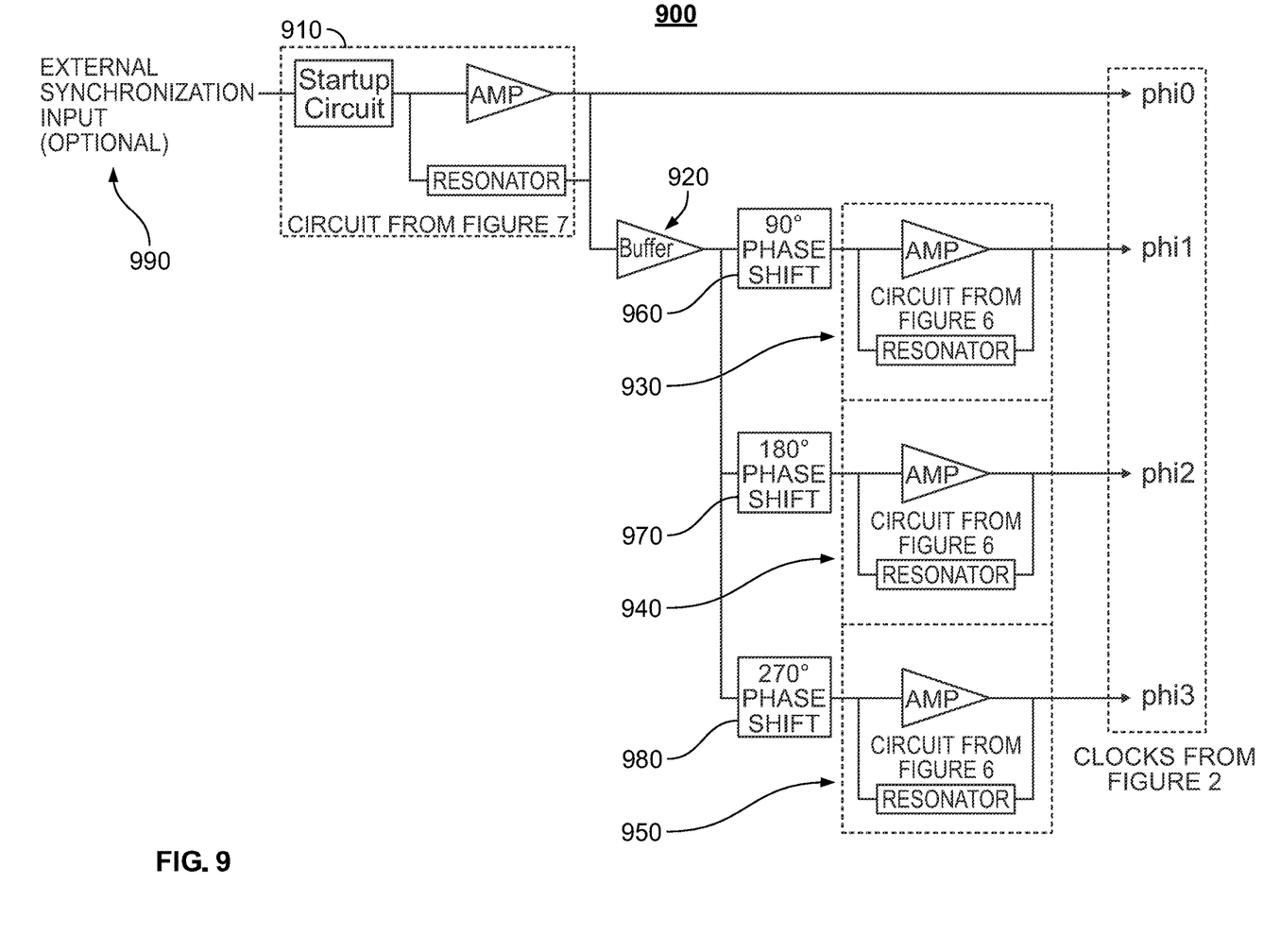
FIG. 9 illustrates a four-clock adiabatic oscillator system in accordance with one or more embodiments of the present invention.

With the creation of a single adiabatic clock signal completed, it is straightforward to create the other phase-separated clocks for a four- or six-clock adiabatic oscillator system. This is done by creating clones of the adiabatic oscillator 700 illustrated in FIG. 7, and then phase-locking these secondary adiabatic oscillators to the primary adiabatic oscillator while adding in the desired amount of phase separation between the first adiabatic oscillator output and the clone adiabatic oscillator outputs, as illustrated in the exemplary four-clock adiabatic oscillator system 900 illustrated in FIG. 9. At least one embodiment of the present invention implements this using a phase-shifted, amplitude-attenuated version of the output of the primary adiabatic oscillator 910 passing through a buffer 920, to decrease the effects of next-stage loading, as an input feed to the secondary adiabatic oscillators 930, 940, 950. By selecting three different phase-shifting circuits 960, 970, 980, with appropriate degrees of phase shift to induce output oscillator phase shifts of 90° (phase-shifting circuit 960), 180° (phase-shifting circuit 970), and 270° (phase-shifting circuit 980), it is possible to create the required four clocks needed for 2LAL or some SCRL adiabatic computational circuits, as illustrated in FIG. 2. Note that the phase-shifting circuits 960, 970, 980 have phase shifts of an amount sufficient to shift the outputs, not the inputs, of the secondary adiabatic oscillators 930, 940, 950 by 90°, 180°, and 270°, respectively. The injection of a small-amplitude, phase shifted version of the primary adiabatic oscillator 910 affects the phase angle that the secondary adiabatic oscillators 930, 940, 950 settle on as each starts to oscillate. By setting the amplitude of the injected signal to an appropriate level, each secondary adiabatic oscillator 930, 940, 950 maintains its phase-locked relationship to the primary adiabatic oscillator 910. In one or more simulations or physical circuit embodiments of the present invention, an optional startup circuit 990 may be included.

Figure 10:
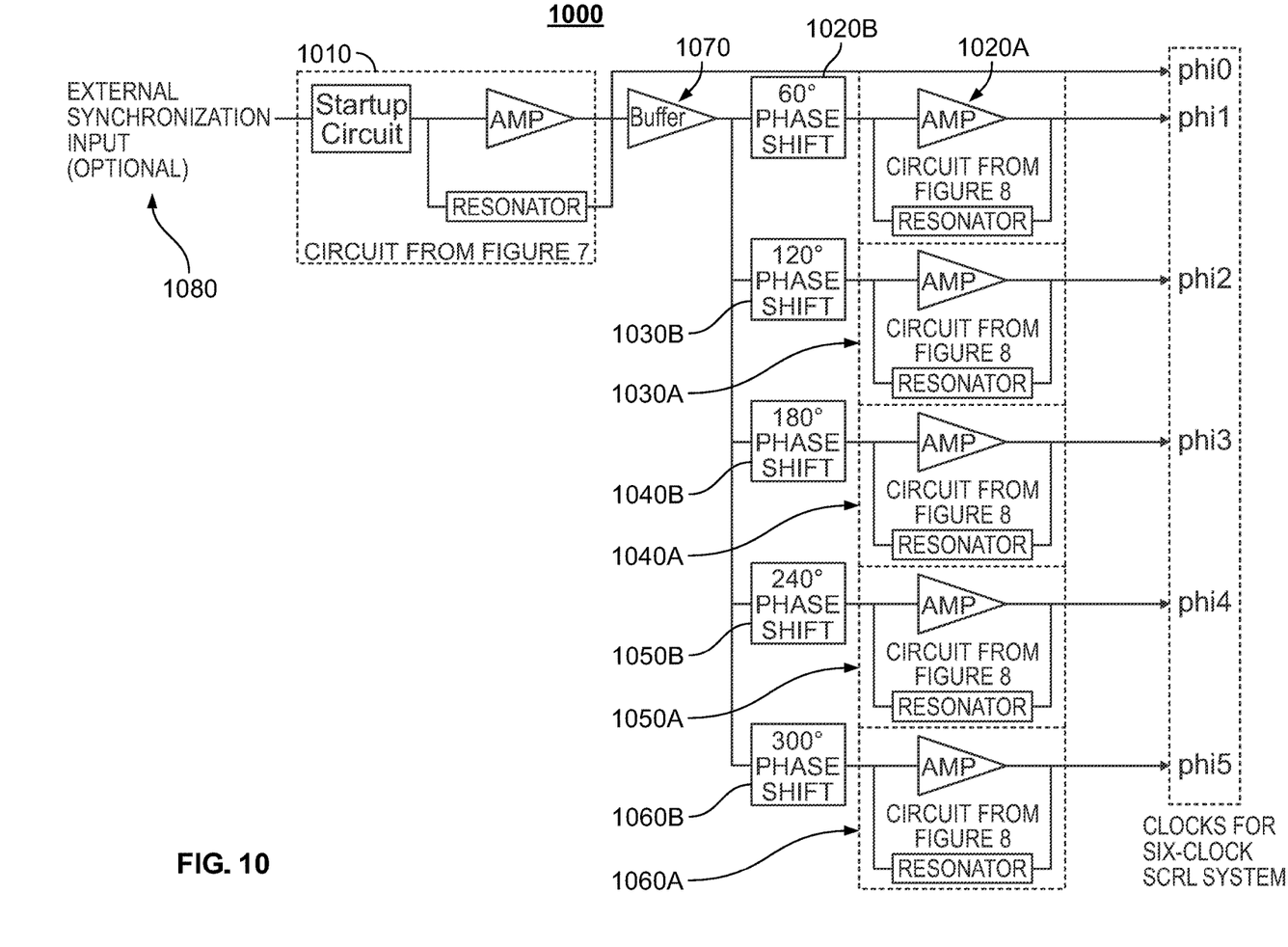
FIG. 10 illustrates a six-clock adiabatic oscillator system in accordance with one or more embodiments of the present invention.

A six-clock adiabatic clock system, needed for some implementations of SCRL adiabatic circuitry, can be created by first creating five clones of the adiabatic oscillator 700 illustrated in FIG. 7. One embodiment of this six-clock adiabatic oscillator system 1000, in accordance with one or more embodiments of the present invention, is illustrated in FIG. 10. The output of the primary adiabatic oscillator 1010 can be used to create the phase-shifted inputs to the secondary adiabatic oscillators 1020A, 1030A, 1040A, 1050A, 1060A. This can be done by first buffering the signal to decrease the effects of next-stage loading by using a buffer 1070. Then the output of the buffer 1070 from the primary adiabatic oscillator 1010 is phase shifted by appropriate amounts to provide output phase shifts of 60°, 120°, 180°, 240°, and 300° (using phase-shifting circuits 1020B, 1030B, 1040B, 1050B, 1060B, respectively) from the outputs of the phase-locked secondary adiabatic oscillators 1020A, 1030A, 1040A, 1050A, 1060A. In one or more simulations or physical circuit embodiments of the present invention, an optional startup circuit 1080 may be included.

Other methods for phase-locking four- or six-clock adiabatic oscillators are employed in other embodiments of the present invention. These methods generally involve the injection of a phase shifted signal from the primary adiabatic oscillator into the secondary oscillators as is described above. The more advanced methods of phase-locking may also employ feedback from the secondary oscillators to adjust the amplitude or phase of the injected signal. These more sophisticated methods of phase-locking might employ measuring the output amplitude and phase of the secondary oscillators using analog-to-digital converters, and using digital signal processing to calculate, and digital-to-analog converters to implement appropriate phase shifts and amplitude injection values.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An adiabatic oscillator system comprising:
   a primary adiabatic oscillator including a primary adiabatic oscillator output;
   a buffer electrically coupled to the primary adiabatic oscillator output, the buffer including a buffer output, the buffer adapted to decrease an effect of next-stage loading;
   N secondary adiabatic oscillators each including a respective secondary adiabatic oscillator output; and
   N phase-shifting circuits each electrically coupled to the buffer output, each of the N phase-shifting circuits including a respective phase-shifting circuit output, each of the N secondary adiabatic oscillators electrically coupled to a respective one of the phase-shifting circuit outputs, each of the N phase-shifting circuits adapted to induce a corresponding phase shift at a corresponding one of the secondary adiabatic oscillator outputs;
   the primary adiabatic oscillator and each of the N secondary adiabatic oscillators each including:

an amplifier; and
an adiabatic resonator, the adiabatic resonator adapted to provide feedback to the amplifier, the adiabatic resonator including a plurality of tank circuits.

2. The adiabatic oscillator system of claim 1, wherein the amplifier in each of the primary adiabatic oscillator and the N secondary adiabatic oscillators is one of an inverting amplifier, a differential amplifier, a cascode-connected amplifier, a class A amplifier, a class AB amplifier, a class C amplifier, a class D amplifier, a class E amplifier, or a class F amplifier.

3. The adiabatic oscillator system of claim 1, wherein each of the plurality of tank circuits includes:
a capacitor or capacitive reactance element; and
an inductor or an inductive reactance element, the capacitor or capacitive reactance element and the inductor or inductive reactance element electrically connected in series or parallel.

4. The adiabatic oscillator system of claim 3, wherein the inductor in each of the plurality of tank circuits has a same value.

5. The adiabatic oscillator system of claim 1, wherein each adiabatic resonator further includes a plurality of winding-weighted transformers or weighted waveguide transformers, the plurality of tank circuits being electrically connected in series using the plurality of winding-weighted transformers or weighted waveguide transformers, and each of the winding-weighted transformers or weighted waveguide transformers having a corresponding weighting factor.

6. The adiabatic oscillator system of claim 5, wherein each of the weighting factors corresponds to a respective Fourier series weighting factor.

7. The adiabatic oscillator system of claim 1, wherein the plurality of tank circuits includes at least three tank circuits.

8. The adiabatic oscillator system of claim 1, wherein N equals 3 or 5.

9. The adiabatic oscillator system of claim 1, wherein the primary adiabatic oscillator further includes a startup circuit.

10. The adiabatic oscillator system of claim 1, wherein the primary adiabatic oscillator and each of the N secondary adiabatic oscillators each outputs a corresponding substantially trapezoidal waveform.

11. An adiabatic oscillator comprising:
an amplifier; and
an adiabatic resonator, the adiabatic resonator adapted to provide feedback to the amplifier, the adiabatic resonator including a plurality of tank circuits;
wherein each of the plurality of tank circuits includes a capacitor or capacitive reactance element and an inductor or inductive reactance element, the capacitor or capacitive reactance element and the inductor or inductive reactance element electrically connected in series or parallel.

12. The adiabatic oscillator of claim 11, wherein the amplifier is one of an inverting amplifier, a differential amplifier, a cascode-connected amplifier, a class A amplifier, a class AB amplifier, a class C amplifier, a class D amplifier, a class E amplifier, or a class F amplifier.

13. The adiabatic oscillator of claim 11, wherein the inductor in each of the plurality of tank circuits has a same value.

14. The adiabatic oscillator of claim 11, wherein the adiabatic resonator further includes a plurality of winding-weighted transformers or weighted waveguide transformers, the plurality of tank circuits being electrically connected in series using the plurality of winding-weighted transformers or weighted waveguide transformers, each of the winding-weighted transformers or weighted waveguide transformers having a corresponding weighting factor, wherein each of the weighting factors corresponds to a respective Fourier series weighting factor.

15. The adiabatic oscillator of claim 11, wherein the plurality of tank circuits includes at least three tank circuits.

16. The adiabatic oscillator of claim 11, further comprising a startup circuit.

17. The adiabatic oscillator of claim 11, wherein the adiabatic oscillator outputs a substantially trapezoidal waveform.

18. An adiabatic resonator comprising:
a plurality of tank circuits; and
a plurality of winding-weighted transformers or weighted waveguide transformers, the plurality of tank circuits being electrically connected in series using the plurality of winding-weighted transformers or weighted waveguide transformers, each of the winding-weighted transformers or weighted waveguide transformers having a corresponding weighting factor, wherein each of the weighting factors corresponds to a respective Fourier series weighting factor;
wherein each of the plurality of tank circuits includes a capacitor or capacitive reactance element and an inductor or inductive reactance element, the capacitor or capacitive reactance element and the inductor or inductive reactance element electrically connected in series or parallel.

19. The adiabatic resonator of claim 18, wherein the inductor in each of the plurality of tank circuits has a same value.

* * * * *